United States Patent
Shin et al.

(10) Patent No.: US 7,579,861 B2
(45) Date of Patent: Aug. 25, 2009

(54) IMPEDANCE-CONTROLLED PSEUDO-OPEN DRAIN OUTPUT DRIVER CIRCUIT AND METHOD FOR DRIVING THE SAME

(75) Inventors: Dong-Suk Shin, Kyoungki-do (KR);
Inhwa Jung, Kyoungki-do (KR);
Chulwoo Kim, Kyoungki-do (KR);
Hyung-Dong Lee, Kyoungki-do (KR);
Young-Jung Choi, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/906,365

(22) Filed: Oct. 1, 2007

(65) Prior Publication Data
US 2008/0079458 A1 Apr. 3, 2008

(30) Foreign Application Priority Data
Oct. 2, 2006 (KR) .................. 10-2006-0097295

(51) Int. Cl.
*H03K 17/16* (2006.01)
*H03K 19/003* (2006.01)
(52) U.S. Cl. ............................. 326/26; 326/27; 326/30
(58) Field of Classification Search ................. None
See application file for complete search history.

(56) References Cited

U.S. PATENT DOCUMENTS 6,256,235 B1 * 7/2001 Lee ..................... 365/189.11
6,642,742 B1 * 11/2003 Loyer .......................... 326/30
6,819,157 B2 * 11/2004 Cao et al. .................... 327/262
7,142,027 B2 * 11/2006 Lee et al. ..................... 327/158

FOREIGN PATENT DOCUMENTS

KR 1020030018742 A 3/2003
KR 1020040074682 A 8/2004

OTHER PUBLICATIONS

"A One-Cycle Lock Time Slew-Rate-Controlled Output Driver" by Young-Ho Kwak, et al.; *IEEE International Solid-State Circuits Conference 2007*; Feb. 14, 2007; Session 22/Digital Circuit Innovations/22.6; pp. 408-409, 611.

* cited by examiner

*Primary Examiner*—Anh Q Tran
(74) *Attorney, Agent, or Firm*—Blakely, Sokoloff, Taylor & Zafman

(57) ABSTRACT

An impedance-controlled pseudo-open drain output driver circuit includes: a process, voltage, and temperature (PVT) detector configured to have a delay line receiving a reference clock and detect a state variation of the delay line according to PVT conditions to output detection signals; a select signal generator configured to generate a driving select signal based on the detection signals and an output data; and an output driver configured to drive an output terminal, the output driver including a plurality of pull-up/pull-down driving blocks controlled by the driving select signal, each of the pull-up/pull-down driving blocks including a resistor having an intended impedance.

16 Claims, 6 Drawing Sheets

IMPEDANCE-CONTROLLED PSEUDO-OPEN DRAIN OUTPUT DRIVER CIRCUIT AND METHOD FOR DRIVING THE SAME

CROSS-REFERENCE TO RELATED APPLICATIONS

The present invention claims priority of Korean patent application number 10-2006-0097295, filed on Oct. 2, 2006, which is incorporated by reference in its entirety.

BACKGROUND OF THE INVENTION

The present invention relates to a semiconductor device, and more particularly, to an impedance-controlled pseudo-open drain output driver circuit and a method for driving the same.

An output driver circuit is an interface circuit to drive an output pad (DQ), to which a predetermined load is connected, so as to output an internal data of a semiconductor device to an external circuit.

A pseudo-open drain driver is an interface circuit adopted as a standard in Graphics Double Data Rate 3 (GDDR3). While a push-pull driver is based on a current, a pseudo-open drain driver is based on a voltage.

To control an output impedance, a conventional pseudo-open drain output driver circuit repeats a process of changing an impedance code of an output driver circuit using an external resistor having a desired output impedance until the output impedance is equal to the output impedance. The pseudo-open drain output driver circuit can serve as an output driver circuit only when the output impedance is determined after the closed-loop process is completed.

However, the conventional pseudo-open drain output driver circuit is not suitable for high-speed operation because a locking time is long and inconstant. In addition, error may occur when the resistance is matched at the outside.

SUMMARY OF THE INVENTION

Embodiments of the present invention are directed to an impedance-controlled pseudo-open drain output driver circuit, which can reduce impedance locking time and minimize the occurrence of impedance matching error.

In accordance with an aspect of the present invention, there is provided an impedance-controlled pseudo-open drain output driver circuit, including: a process, voltage, and temperature (PVT) detector configured to have a delay line receiving a reference clock and detect a state variation of the delay line according to PVT conditions to output detection signals; a select signal generator configured to generate a driving select signal based on the detection signals and an output data; and an output driver configured to drive an output terminal, the output driver including a plurality of pull-up/pull-down driving blocks controlled by the driving select signal, each of the pull-up/pull-down driving blocks including a resistor having an intended impedance.

In accordance with another aspect of the present invention, there is provided a method for driving an output driver circuit, including: detecting a state variation of a delay line receiving a reference clock according to PVT conditions to output detection signals; generating a driving select signal based on the detection signals and an output data; and driving an output terminal, the output driver including a plurality of pull-up/pull-down driving blocks controlled by the driving select signal, each of the pull-up/pull-down driving blocks including a resistor having an intended impedance.

DESCRIPTION OF SPECIFIC EMBODIMENTS

In the conventional impedance-controlled pseudo-open drain output driver circuit, an impedance matching error occurs due to the use of external resistors, and an impedance locking time increases due to the implementation of the closed-loop circuits. However, the impedance-controlled pseudo-open drain output driver circuit in accordance with the embodiments of the present invention can minimize the impedance matching error by using internal control circuits, instead of external impedance matching resistors. Further, the impedance locking can be achieved through the open-loop configuration within one clock period, thereby realizing the clock-on-demand. Moreover, the output driver circuit is controlled using CMOS digital logics, thereby reducing chip area and power consumption.

Hereinafter, an impedance-controlled pseudo-open output driver circuit in accordance with the present invention will be described in detail with reference to the accompanying drawings.

Figure 1:
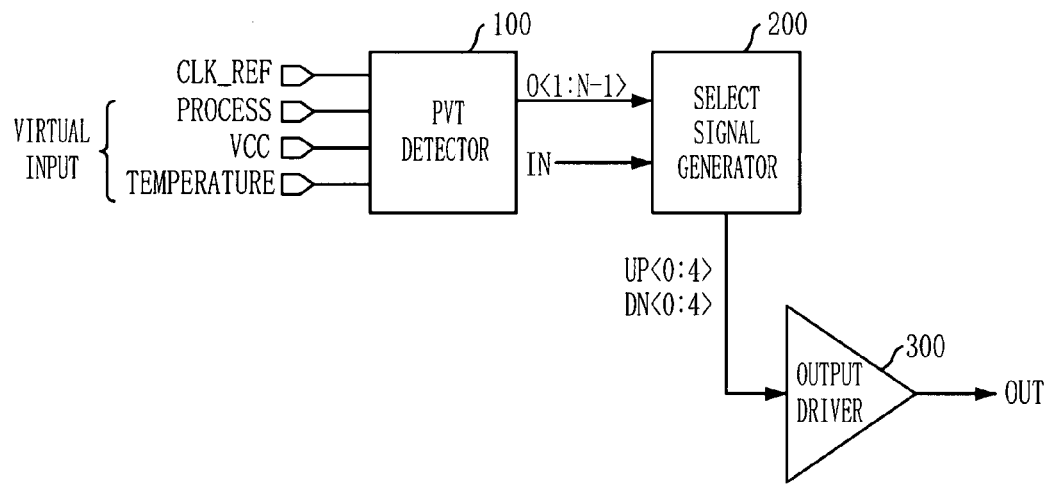
FIG. 1 is a block diagram of an impedance-controlled output driver circuit in accordance with an embodiment of the present invention.

FIG. 1 is a block diagram of an impedance-controlled output driver circuit in accordance with an embodiment of the present invention.

As shown, the impedance-controlled output driver circuit includes a PVT detector 100, a select signal generator 200, and an output driver 300. The PVT detector 100 includes a delay line receiving a reference clock CLK_REF, and detects a state variation of the delay line according to process, voltage, and temperature (PVT) conditions to output a detection signal group O<1:N>. The select signal generator 200 generates a driving select signal including a pull-up select signal group UP<0:4> and a pull-down select signal group DN<0:4> based on an input signal IN and the detection signal group O<1:N> outputted from the PVT detector 100. The output driver 300 drives an output terminal OUT in response to the driving select signal. The output driver 300 includes a plurality of pull-up/pull-down driving blocks controlled by the driving select signal. Each of the pull-up/pull-down driving blocks includes a resistor having an intended impedance.

The PVT detector 100 does not receive separate input signals indicating the PVT conditions, but uses delay values of the delay line, which change according to the PVT conditions. Therefore, the expression "virtual input" is used.

Figure 2:
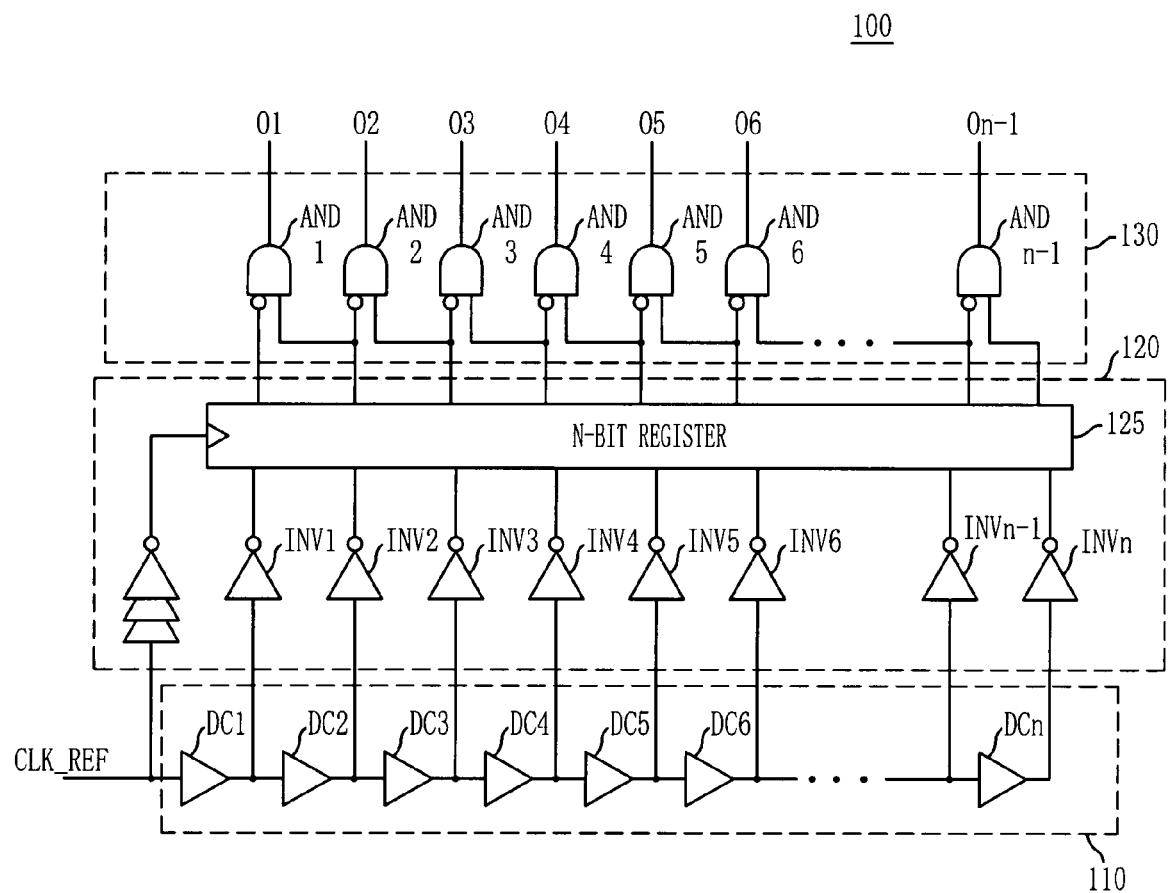
FIG. 2 is a circuit diagram of a PVT detector of FIG. 1.

FIG. 2 is a circuit diagram of the PVT detector 100 of FIG. 1.

As shown, the PVT detector 100 includes a delay line 110, a digitizer unit 120, and a switching detection unit 130. The delay line 110 receives the reference clock CLK_REF to output a multi-phase clock signal group having a constant phase difference. The digitizer unit 120 digitizes levels of the multi-phase clock signal group outputted from the delay line 110. The switching detection unit 130 detects a point in which an output of the digitizer unit 120 is changed.

The delay line 110 includes n number of delay cells DC1, DC2, ..., DCn connected in an open loop configuration. Each of the delay cells DC1, DC2, ..., DCn may have substantially the same circuit configuration as the output driver, so that it can have the same PVT variation characteristics as the output driver. For example, each of the delay cells DC1, DC2, ..., DCn may be implemented with two serially-connected static inverters. In this case, power consumption is low and high-impedance state can be excluded.

The digitizer unit 120 includes n number of inverters INV1, INV2, ..., INVn and an N-bit register 125. The inverters INV1, INV2, ..., INVn receive the multi-phase clock signal group from the delay cells DC1, DC2, ..., DCn of the delay line 110, respectively. The N-bit register 125 latches output signals of the inverters INV1, INV2, ..., INVn in response to the reference clock CLK_REF.

The switching detection unit 130 performs an exclusive OR operation on a corresponding bit value and a next bit value of the N-bit register 125 and detects a point in which the output of the digitizer unit 120 is changed. The switching detection unit 130 may include (n−1) number of inverters (indicated by an inverting input symbol in FIG. 2), and (n−1) number of AND gates AND1, AND2, ..., ANDn−1. The inverters invert bit values outputted from the N-bit register 125. The AND gates AND1, AND2, ..., ANDn perform an AND operation on the bit value inverted by the inverter and a next bit value to output a detection signal group O<1:n−1>. For the last bit value outputted from the N-bit register 125, its next bit value does not exist. Therefore, the number of the inverters and the number of the AND gates are not "n" but "n−1".

The N-bit register 125 of the digitizer unit 120 may include n number of D flip-flops configured to receive the output signals of the inverters INV1, INV2, ..., INVn as data inputs, and the delayed reference clock as clock inputs.

Figure 3:
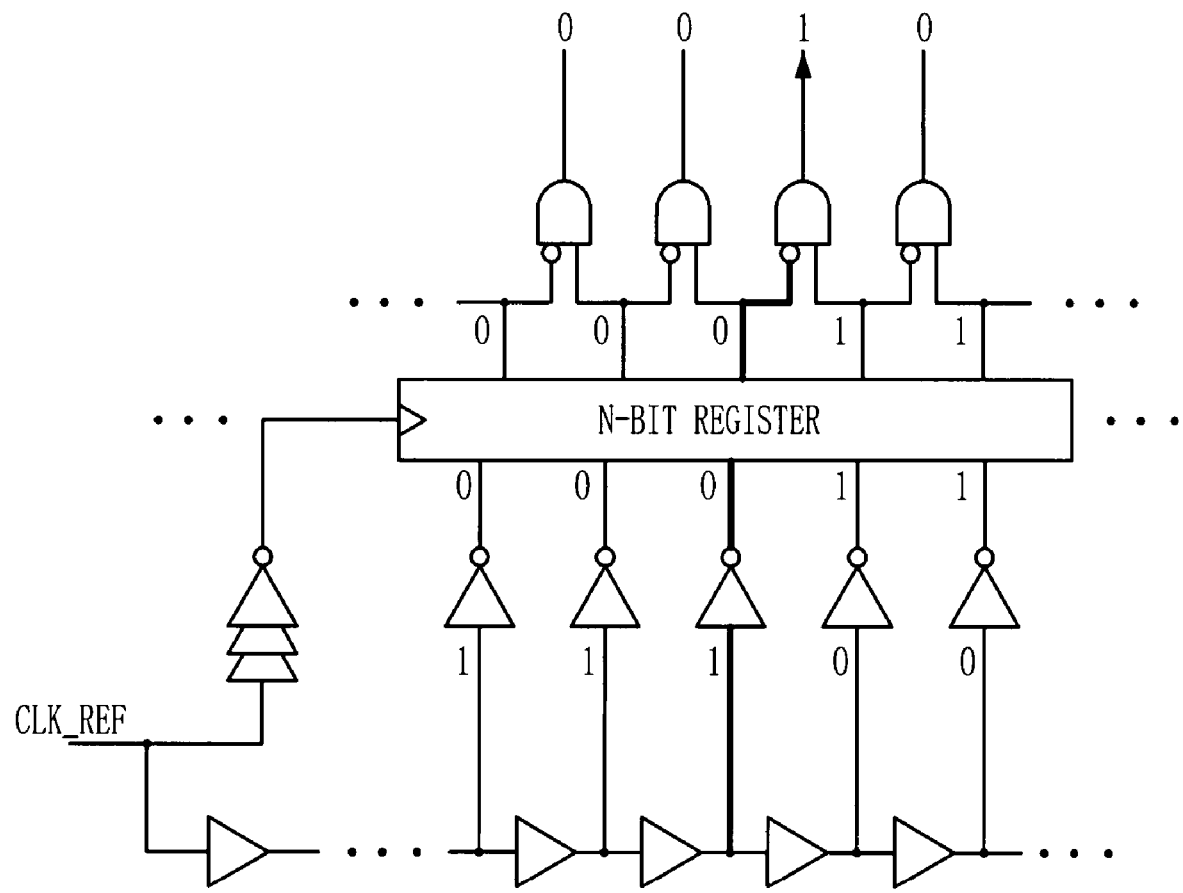
FIG. 3 is a circuit diagram illustrating an operation principle of the PVT detector of FIG. 2.

FIG. 3 is a circuit diagram illustrating an operation principle of the PVT detector 100 of FIG. 2.

Assuming that the number of the delay cells in the delay line 120 is twenty, the delay line 110 receives the reference clock CLK_REF to output twenty multi-phase clock signals having a constant phase difference.

When the multi-phase clock signal group is captured at a specific phase, a specific point when each multi-phase clock signal changes from a logic high level to a logic low level occurs. The multi-phase clock signals have an arbitrary voltage in the range between a ground voltage (VSS) and a power supply voltage (VDD). The arbitrary voltage is not the ground voltage (VSS) and the power supply voltage (VDD) but a middle value of the ground voltage (VSS) and the power supply voltage (VDD).

The multi-phase clock signals have digital values of a logic low level or a logic high level due to regenerative characteristics of the inverters INV1, INV2, ..., INVn, while passing through the inverters INV1, INV2, ..., INVn. The digital values are latched in the N-bit register 125. The latch point, i.e., the capture point of the multi-phase clock signals, is determined by how much the clock inputted to the N-bit register 125 is delayed from the reference clock CLK_REF. This is indicated by several inverters overlapped with one another. The inverters INV1, INV2, ..., INVn of the digitizer unit 120 prevent the load capacitance from changing when the D flip-flops of the N-bit register 125 are switched. Consequently, the delay cells can maintain a constant delay value (τ) without regard to data even through the data changes to a logic high level or a logic low level.

The switching detection unit 130 finds a point in which the output value of the N-bit register 125 of the digitizer unit 120 changes from a logic low level to a logic high level, that is, the delay cell that changes from a logic high level to a logic low level. Because the switching detection unit 130 detects only the point in which the output value of the N-bit register 125 changes from a logic low level to a logic high level, the exclusive OR gate can be implemented with the inverter and the AND gate.

As described above, the PVT detector 100 detects the PVT variation by detecting the change in the delay amount of the delay cells DC1, DC2, ..., DCn varying according to the PVT conditions. The PVT detector 100 counts the delay cells that output a logic high level in the above PVT conditions.

Figure 4:
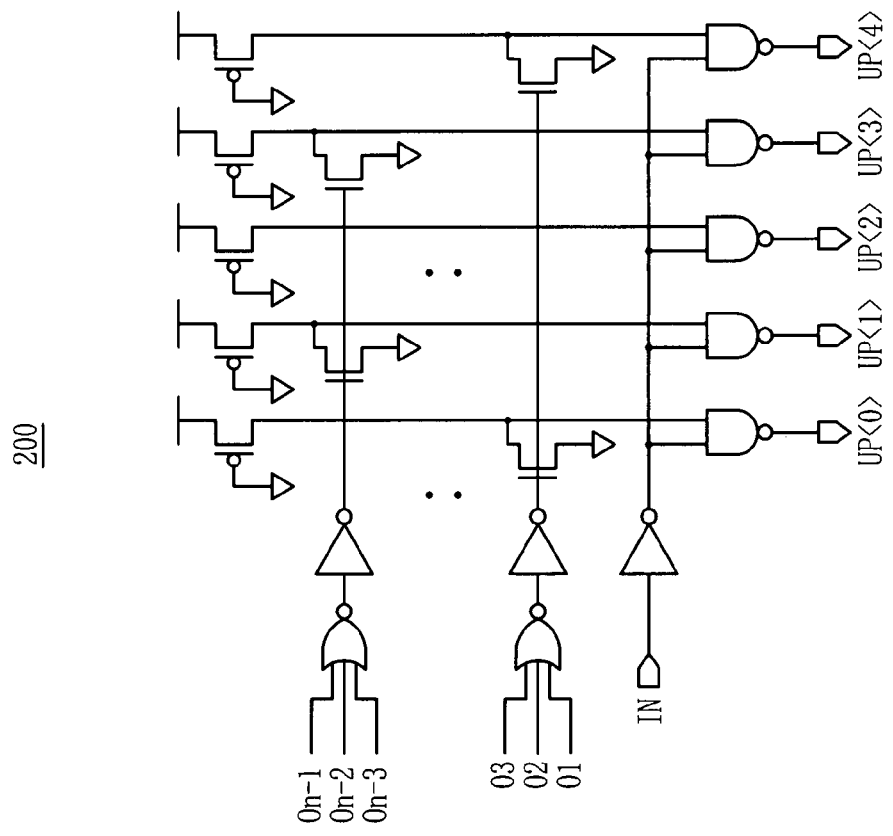
FIG. 4 is a circuit diagram of a select signal generator of FIG. 1.
Figure 4:
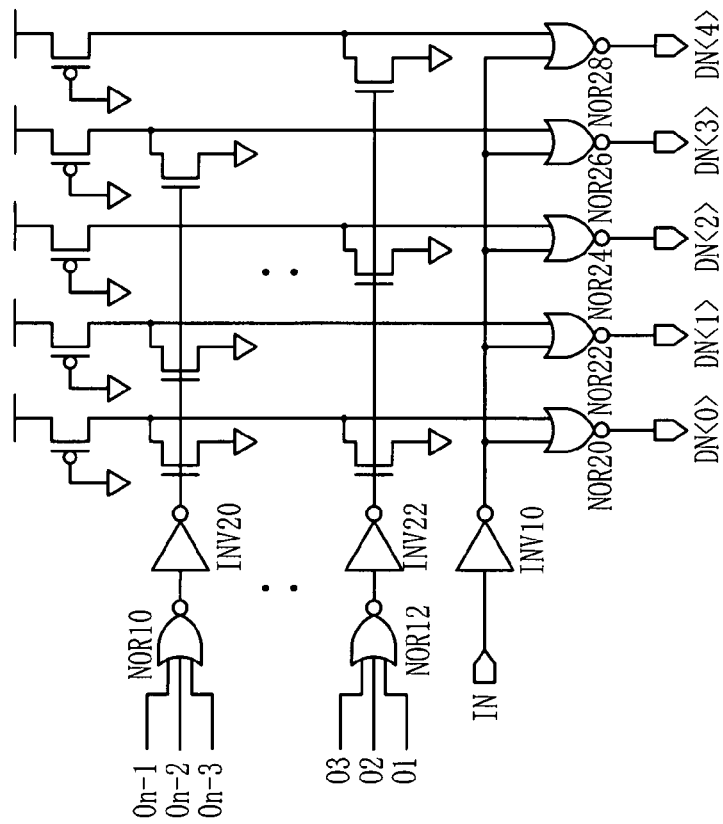

FIG. 4 is a circuit diagram of the select signal generator 200 of FIG. 1.

As shown, the select signal generator 200 includes a pull-down select signal generator and a pull-up select signal generator.

The pull-down select signal generator includes first to seventh NOR gates NOR10, NOR12, NOR20, NOR22, NOR24, NOR26 and NOR28, first to third inverters INV10, INV20 and INV22, and a plurality of current-source PMOS transistors and current-sink NMOS transistors.

The first NOR gate NOR10 receives some bits of the (N−1)-bit detection signal group O<1:n−1> outputted from the PVT detector 100. The second NOR gate NOR12 receives some bits of the (N−1)-bit detection signals O<1:n−1> outputted from the PVT detector 100. The first inverter INV10 inverts the input signal IN. The second inverter INV20 inverts an output of the first NOR gate NOR10, and the third inverter INV22 inverts an output of the second NOR gate NOR12. Each of the third to seventh NOR gates NOR20 to NOR28 receives an output of the first inverter INV10 and a corresponding signal controlled by outputs of the second and third inverters INV20 and INV22 to thereby output a corresponding one of the pull-down select signal group DN<0:4> corresponding to the respective bits of the driving select signal. Herein, the pull-down select signal group DN<0:4> are determined by the current-source PMOS transistors and the current-sink NMOS transistors. The current-source PMOS transistors are always turned on. In another embodiment, the current-source PMOS transistors are turned off in a power-down mode in response to a power-down signal PWR_DN. The current-sink NMOS transistors controlled by the outputs of the second and third inverters INV20 and INV22. Further, combinations of the current-sink NMOS transistors are determined by a table which is made according to impedance of resistors in arrangement with each pull-down driving block of the output driver 300.

The pull-up select signal generator has substantially the same structure as that of the pull-down select signal generator except for the NOR gates. That is, the pull-up select signal generator includes first to fifth NAND gates, each for outputting a corresponding one of the pull-up select signal group UP<0:4> corresponding to the respective bits of the driving select signal. Likewise, combinations of the current-sink NMOS transistors are determined by a table which is made according to impedance of resistors in arrangement with each pull-down driving block of the output driver 300.

The select signal generator 200 of FIG. 4 is merely illustrative. The method of generating the driving select signal by combining the detection signal group O<1:n−1> of the switching detection unit 130 can be implemented in various ways.

Figure 5:
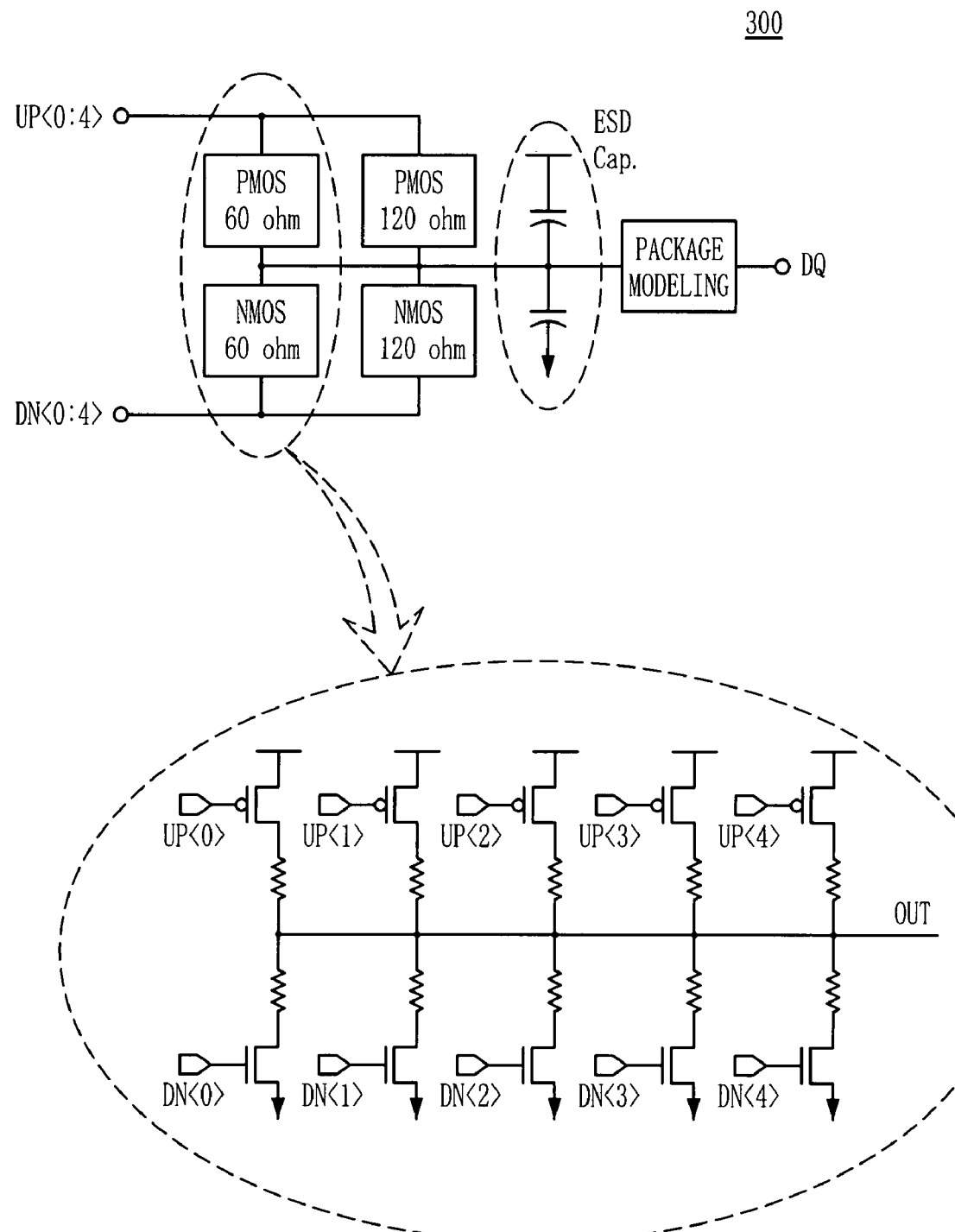
FIG. 5 is a circuit diagram of an output driver circuit of FIG. 1.

FIG. 5 is a circuit diagram of the output driver 300 of FIG. 1.

As shown, the output driver 300 includes a plurality of pull-up driving blocks and a plurality of pull-down driving blocks. The pull-up driving blocks are responsive to the pull-up select signal group UP<0:4> outputted from the select signal generator 200 and have different impedance matching resistances. The pull-down driving blocks are responsive to the pull-down select signal group DN<0:4> outputted from the select signal generator 200 and have different impedance matching resistances. The pull-up driving block and the pull-down driving block have the impedance matching resistances of 60Ω and 120Ω. An exploded view in the lower side of FIG. 5 illustrates the pull-up driving block and the pull-down block having the impedance matching resistance of 60Ω.

One driving block is selected by the pull-up select signal group UP<0:4> and the pull-down select signal group DN<0:4> to thereby drive the output terminal OUT.

The output driver 300 is designed considering a package modeling and an electrostatic discharge (ESD) capacitance.

Figure 6:
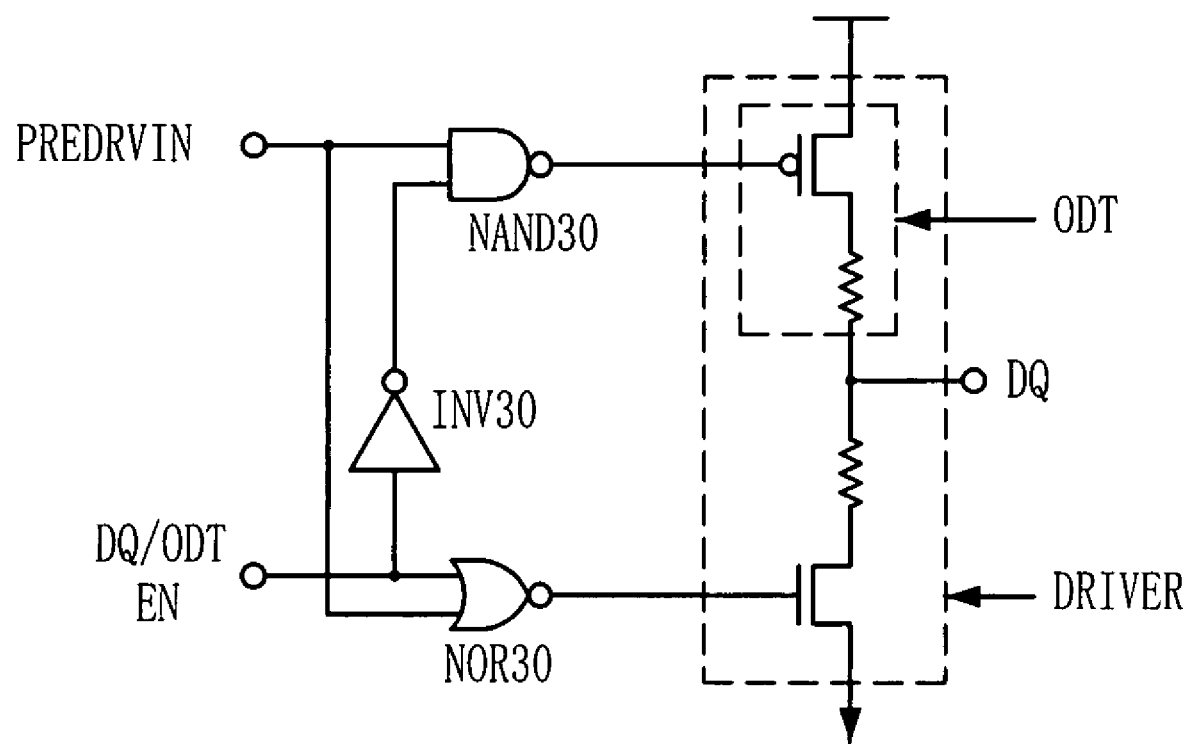
FIG. 6 is a circuit diagram of the output driver circuit applied as an ODT.

FIG. 6 is a circuit diagram of the output driver 300 applied as an on-die termination (ODT).

As shown, the output driver 300 is used as the ODT when only pull-up PMOS blocks are enabled in response to a DQ/ODT enable signal DQ/ODTEN for separating the ODT function and the driver function. In this case, in order to provide the same impedance as a 60-Ω transmission line, only a PMOS 60-ohm block is enabled and the other blocks are disabled. The output driver 300 must have the impedance of 40Ω so as to serve as the driver for transferring data. The impedance of 40Ω enables both the PMOS 60-ohm block and the PMOS 120-ohm block and the two resistors are connected in parallel to thereby yield 40Ω. A NAND gate NAND30, a NOR gate NOR30, an inverter INV30, and a pre-driving signal PREDRIVIN are illustrated in FIG. 6.

Figure 7:
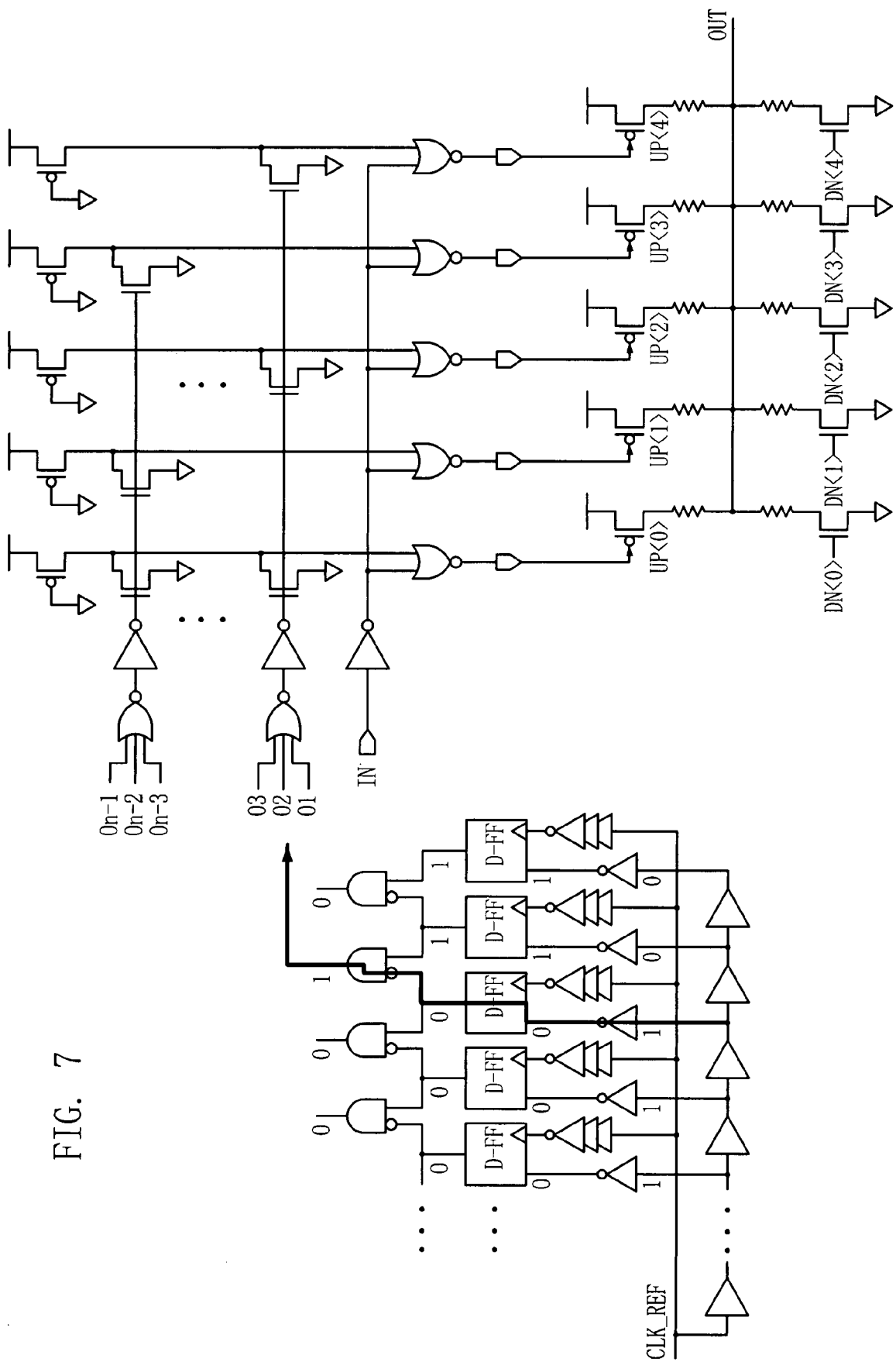
FIG. 7 is a circuit diagram illustrating an overall operation of the output driver circuit of FIG. 1.

FIG. 7 is a circuit diagram illustrating an overall operation of the output driver circuit of FIG. 1.

When the reference clock CLK_REF is inputted to the PVT detector 100, the number of the delay cells is determined and the detection signal group O<1:n−1> is outputted. The select signal generator 200 outputs the driving select signal including the pull-up select signal group UP<0:4> and the pull-down select signal group DN<0:4> according to the detection signal group O<1:n−1> and the output of the resistance/temperature sensor 400. Meanwhile, a specific driving block of the output driver 300 is selected by the driving select signal. The pull-up PMOS transistors and the pull-down NMOS transistors are controlled by the respective bits of the driving select signal. In this way, the output terminal is driven.

The above-described operation begins at the falling edge of the reference clock CLK_REF and finishes at the next rising edge. Because the open loop structure is adopted, the detection of the PVT variation and the generation of the driving select signal can be achieved during one clock period. Thus, a so-called clock-on-demand can be realized.

While the conventional output driver circuit occupies a large area and consumes much power because of analog blocks, the output driver circuit in accordance with the embodiments of the present invention can be implemented in a small area, reduce the power consumption, and reduce the difficulty of design because the PVT detector 100 and the driving select signal generator 200 are configured with CMOS digital logics.

The output driver circuit in accordance with the embodiments of the present invention can operate at high speed because of its short impedance locking time. The power management can be achieved through the power-down. Further, the error can be minimized because the external resistors are not used. Moreover, the output driver circuit can be implemented in a small chip area.

In the above-described embodiments, kinds and locations of the logics and the MOS transistors can be changed according to the active levels of the input signals or the active levels of the output signals.

While the present invention has been described with respect to the specific embodiments, it will be apparent to those skilled in the art that various changes and modifications may be made without departing from the spirit and scope of the invention as defined in the following claims.

What is claimed is:

1. An impedance-controlled pseudo-open drain output driver circuit, comprising:
   a process, voltage, and temperature (PVT) detector configured to have a delay line receiving a reference clock and detect a state variation of the delay line according to PVT conditions to output detection signals;
   a select signal generator configured to generate a driving select signal having at least one pull-up select signal and at least one pull-down select signal based on the detection signals and an output data; and
   an output driver configured to drive an output terminal, the output driver including a plurality of pull-up/pull-down driving blocks controlled by the driving select signal having the at least one pull-up select signal and the at least one pull-down select signal, each of the pull-up/pull-down driving blocks including a resistor having an intended impedance.

2. The impedance-controlled pseudo-open drain output driver circuit as recited in claim 1, wherein the PVT detector comprises:
   the delay line configured to receive the reference clock to output multi-phase clock signals having a constant phase difference;
   a digitizer unit configured to digitize levels of the multi-phase clock signals outputted from the delay line; and
   a switching detection unit configured to detect a point in which an output of the digitizer unit is changed.

3. The impedance-controlled pseudo-open drain output driver circuit as recited in claim 2, wherein the delay line comprises a plurality of delay cells connected in an open loop configuration.

4. The impedance-controlled pseudo-open drain output driver circuit as recited in claim 3, wherein each of the delay cells is implemented with two serially-connected static inverters.

5. The impedance-controlled pseudo-open drain output driver circuit as recited in claim 2, wherein the digitizer unit comprises:
   a plurality of first inverters configured to receive the multi-phase clock signals outputted from the delay cells of the delay line, respectively; and
   an N-bit register configured to latch output signals of the first inverters in response to the reference clock.

6. The impedance-controlled pseudo-open drain output driver circuit as recited in claim 5, wherein the N-bit register includes a plurality of D flip-flops configured to receive the output signals of the first inverters as data inputs, and a delayed signal of the reference clock as clock inputs.

7. The impedance-controlled pseudo-open drain output driver circuit as recited in claim 5, wherein the switching detection unit performs an exclusive OR operation on a corresponding bit value and a next bit value of the N-bit register and detects the point in which the output of the digitizer unit is changed.

8. The impedance-controlled pseudo-open drain output driver circuit as recited in claim 7, wherein the switching detection unit comprises:
   a plurality of second inverters configured to invert bit values outputted from the N-bit register, respectively; and
   a plurality of AND gates configured to perform an AND operation on the bit values inverted by the second inverters and next bit values to output detection signals, respectively.

9. The impedance-controlled pseudo-open drain output driver circuit as recited in claim 1, wherein the select signal generator comprises:
   a pull-up select signal generator configured to generate the plurality of pull-up select signals; and
   a pull-down select signal generator configured to generate the plurality of pull-down select signals.

10. The impedance-controlled pseudo-open drain output driver circuit as recited in claim 9, wherein the pull-down select signal generator comprises:
    a plurality of first NOR gates configured to receive a predetermined number of bits of the detection signal outputted from the PVT detector;
    a plurality of first inverters configured to invert outputs of the first NOR gates;
    a second inverter configured to invert the output data;
    a plurality of third NOR gates configured to output the pull-down select signals based on an output of the second inverter and signals at signal lines corresponding to the respective bits of the pull-down select signals;
    a plurality of current-source PMOS transistors configured to charge the signal lines corresponding to the respective bits of the pull-down select signals; and
    a plurality of current-sink NMOS transistors configured to discharge the signal lines corresponding to the respective bits of the pull-down select signal in response to outputs of the first inverters.

11. The impedance-controlled pseudo-open drain output driver circuit as recited in claim 10, wherein the current-sink NMOS transistors are coupled to the signal lines with various combinations different with each other in response to the outputs of the first inverters.

12. The impedance-controlled pseudo-open drain output driver circuit as recited in claim 9, wherein the pull-up select signal generator comprises:
    a plurality of first NOR gates configured to receive a predetermined number of bits of the detection signal outputted from the PVT detector;
    a plurality of first inverters configured to invert outputs of the first NOR gates;
    a second inverter configured to invert the output data;
    a plurality of third NOR gates configured to output the pull-up select signals based on an output of the second inverter and signals at signal lines corresponding to the respective bits of the pull-up select signals;
    a plurality of current-source PMOS transistors configured to charge the signal lines corresponding to the respective bits of the pull-up select signals; and
    a plurality of current-sink NMOS transistors configured to discharge the signal lines corresponding to the respective bits of the pull-up select signal in response to outputs of the first inverters.

13. The impedance-controlled pseudo-open drain output driver circuit as recited in claim 12, wherein the current-sink NMOS transistors are coupled to the signal lines with various combinations different with each other in response to the outputs of the first Inverters.

14. The impedance-controlled pseudo-open drain output driver circuit as recited in claim 9, wherein the plurality of pull-up driving blocks have different impedance matching resistances based on the pull-up select signals, and the plurality of pull-down driving blocks have different impedance matching resistances based on the pull-down select signals.

15. A method for driving output driver circuit, comprising:
    detecting a state variation of a delay line receiving a reference clock according to PVT conditions to output detection signals;
    generating a driving select signal having at least one pull-up select signal and at least one pull-down select signal based on the detection signals and an output data; and
    driving an output terminal, the output driver including a plurality of pull-up/pull-down driving blocks controlled by the driving select signal, each of the pull-up/pull-down driving blocks including a resistor having an intended impedance.

16. The method as recited in claim 15, wherein the detecting of the state variation of the delay line includes:
    outputting multi-phase clock signals having a constant phase difference by delaying the reference clock;
    digitizing levels of the multi-phase clock signals; and
    detecting a point in which an output of the digitized level is changed.

* * * * *